United States Patent
Farooq et al.

(10) Patent No.: US 11,171,006 B2
(45) Date of Patent: Nov. 9, 2021

(54) SIMULTANEOUS PLATING OF VARYING SIZE FEATURES ON SEMICONDUCTOR SUBSTRATE

(71) Applicant: International Business Machines Corporation, Armonk, NY (US)

(72) Inventors: Mukta Ghate Farooq, Hopewell Junction, NY (US); James J. Kelly, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 16/703,173

(22) Filed: Dec. 4, 2019

(65) Prior Publication Data

US 2021/0175084 A1    Jun. 10, 2021

(51) Int. Cl.
| | |
|---|---|
| *H01L 21/44* | (2006.01) |
| *H01L 21/288* | (2006.01) |
| *H01L 21/768* | (2006.01) |
| *C25D 17/00* | (2006.01) |
| *C25D 5/02* | (2006.01) |
| *C25D 7/12* | (2006.01) |
| *H01L 21/02* | (2006.01) |

(52) U.S. Cl.
CPC .......... *H01L 21/2885* (2013.01); *C25D 5/022* (2013.01); *C25D 7/123* (2013.01); *C25D 17/001* (2013.01); *H01L 21/02645* (2013.01); *H01L 21/76873* (2013.01); *H01L 21/76885* (2013.01)

(58) Field of Classification Search
CPC .......... H01L 21/02645; H01L 21/2885; H01L 21/76873; H01L 21/76885; C25D 1/00; C25D 1/003; C25D 1/02; C25D 1/22; C25D 5/022; C25D 7/123; C25D 17/001; C25D 17/008; C25D 17/06
USPC ......................................... 438/687
See application file for complete search history.

(56) References Cited

U.S. PATENT DOCUMENTS 3,832,176 A * 8/1974 Verstraete et al. ..... H05K 3/108
430/276.1
7,462,942 B2    12/2008 Tan et al.
(Continued)

FOREIGN PATENT DOCUMENTS

CN    104465613 A    3/2015

OTHER PUBLICATIONS

Arai et al., "Cu—Cu direct bonding technology using ultrasonic vibration for flip-chip interconnection," 2015 International Conference on Electronics Packaging and iMAPS All Asia Conference (ICEP-IAAC) pp. 468-472 (Apr. 2015).
(Continued)

*Primary Examiner* — Brook Kebede
(74) *Attorney, Agent, or Firm* — L. Jeffrey Kelly; Michael J. Chang, LLC

(57) ABSTRACT

Techniques for simultaneously plating features of varying sizes on a semiconductor substrate are provided. In one aspect, a method for electroplating includes: placing a shield over a wafer, offset from a surface of the wafer, which covers portions of the wafer and leaves other portions of the wafer uncovered; and depositing at least one metal onto the wafer by electroplating to simultaneously form metallurgical features of varying sizes on the wafer based on the shield altering local deposition rates for the portions of the wafer covered by the shield. An electroplating apparatus is also provided.

20 Claims, 11 Drawing Sheets

(56) References Cited

U.S. PATENT DOCUMENTS

| | | | |
|---|---|---|---|
| 7,608,174 B1* | 10/2009 | Hachman | C25D 1/02 |
| | | | 204/297.01 |
| 8,227,904 B2 | 7/2012 | Braunisch et al. | |
| 8,581,401 B2 | 11/2013 | Lu et al. | |
| 8,742,578 B2 | 6/2014 | Arvin et al. | |
| 8,866,308 B2 | 10/2014 | Roy et al. | |
| 9,343,419 B2 | 5/2016 | Yu et al. | |
| 9,640,521 B2 | 5/2017 | Chang et al. | |
| 9,666,559 B2 | 5/2017 | Wang et al. | |
| 9,693,455 B1 | 6/2017 | Park et al. | |
| 9,799,618 B1 | 10/2017 | Arvin et al. | |
| 10,014,218 B1 | 7/2018 | Shih et al. | |
| 10,163,844 B2 | 12/2018 | Lin et al. | |
| 2005/0133933 A1 | 6/2005 | Shen et al. | |
| 2008/0003805 A1 | 1/2008 | Pang et al. | |
| 2009/0108443 A1 | 4/2009 | Jiang | |
| 2009/0267238 A1 | 10/2009 | Joseph et al. | |
| 2014/0061897 A1 | 3/2014 | Lin et al. | |
| 2014/0321803 A1 | 10/2014 | Thacker et al. | |
| 2014/0321804 A1 | 10/2014 | Thacker et al. | |
| 2014/0361420 A1 | 12/2014 | Yilmaz et al. | |
| 2015/0171015 A1 | 6/2015 | Mahajan et al. | |
| 2015/0364422 A1 | 12/2015 | Zhai et al. | |
| 2018/0286812 A1 | 10/2018 | Jain et al. | |
| 2020/0006241 A1 | 1/2020 | Wu et al. | |

OTHER PUBLICATIONS

Liu et al., "Development of high yield, reliable fine pitch flip chip interconnects with copper pillar bumps and thin coreless substrate," 2015 IEEE 65th Electronic Components and Technology Conference (ECTC), pp. 1713-1717 (May 2015).

English Translation of CN104465613A by Wang Zihao et al., Mar. 25, 2015.

List of IBM Patents or Applications Treated as Related (2 pages).

* cited by examiner

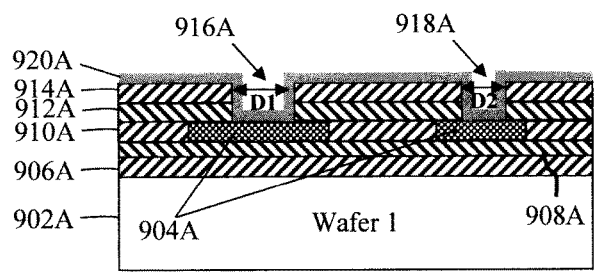
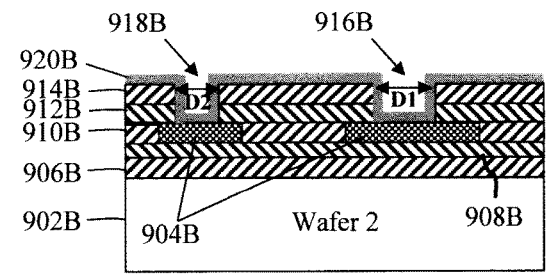
FIG. 9A　　　　　　　　　FIG. 9B
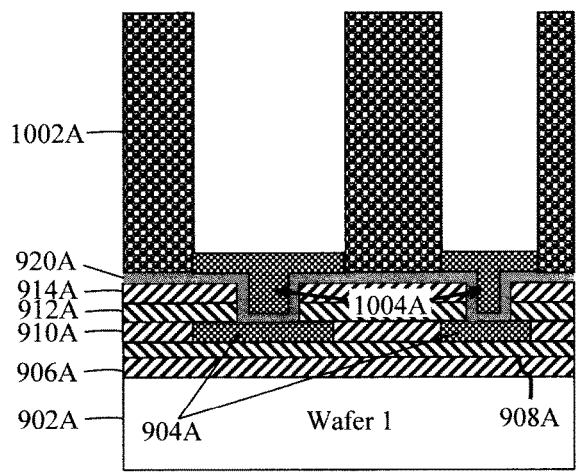
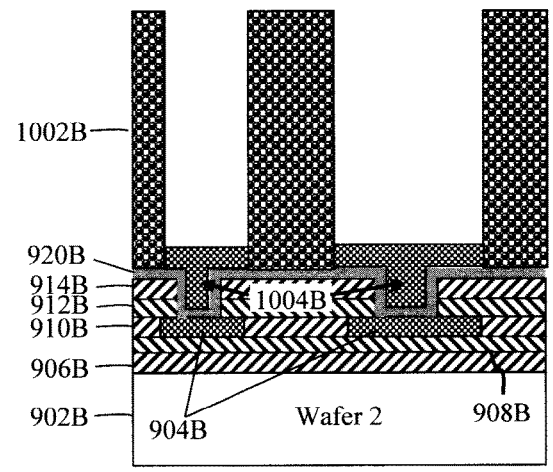
FIG. 10A　　　　　　　　　FIG. 10B

SIMULTANEOUS PLATING OF VARYING SIZE FEATURES ON SEMICONDUCTOR SUBSTRATE

FIELD OF THE INVENTION

The present invention relates to semiconductor metallization, and more particularly, to techniques for simultaneously plating features of varying sizes on a semiconductor substrate.

BACKGROUND OF THE INVENTION

Due to various requirements such as joining of different die or components to a semiconductor chip, it may be desirable to have plated features of varying sizes on the same semiconductor wafer. These features can have varying diameters and/or varying heights.

With conventional processes, the termination of metallurgical features (such as Under Bump Metallurgy) is typically achieved by electroplating through a patterned resist. In order to achieve plated features of different diameters and/or different heights, the most common method is to perform electroplating in consecutive steps, each of which involves a photoresist mask.

The photoresist mask in each step is patterned to enable plating through a seed layer in areas that are exposed or open to electrodeposition. However, performing such a sequence of multiple plating steps is expensive and inefficient.

Therefore, techniques that enable simultaneous plating of features of varying sizes would be desirable.

SUMMARY OF THE INVENTION

The present invention provides techniques for simultaneously plating features of varying sizes on a semiconductor substrate. In one aspect of the invention, a method for electroplating is provided. The method includes: placing a shield over a wafer, offset from a surface of the wafer, which covers portions of the wafer and leaves other portions of the wafer uncovered; and depositing at least one metal onto the wafer by electroplating to simultaneously form metallurgical features of varying sizes on the wafer based on the shield altering local deposition rates for the portions of the wafer covered by the shield. The method can further include: depositing a seed layer onto the wafer; creating a patterned structure on the wafer over the seed layer using a photoresist; placing the shield over the patterned structure; depositing the at least one metal onto the wafer by the electroplating through the patterned structure to simultaneously form the metallurgical features of varying sizes on the wafer; removing the patterned structure; and etching the seed layer.

In another aspect of the invention, an electroplating apparatus is provided. The electroplating apparatus includes: a vessel containing an electrolyte; a wafer immersed in the electrolyte; and a shield positioned over the wafer, offset from a surface of the wafer, which covers portions of the wafer and leaves other portions of the wafer uncovered, wherein the shield is configured to alter local deposition rates during electroplating for the portions of the wafer covered by the shield.

A more complete understanding of the present invention, as well as further features and advantages of the present invention, will be obtained by reference to the following detailed description and drawings.

BRIEF DESCRIPTION OF THE DRAWINGS

FIG. 9A is a cross-sectional diagram illustrating a first wafer having trenches formed in a dielectric stack over metal pads, and a seed layer having been deposited onto the wafer and lining the trenches according to an embodiment of the present invention;

FIG. 9B is a cross-sectional diagram illustrating a second wafer having trenches formed in a dielectric stack over metal pads, and a seed layer having been deposited onto the wafer and lining the trenches according to an embodiment of the present invention;

FIG. 10A is a cross-sectional diagram illustrating a patterned structure for electroplating having been created on the first wafer over the seed layer using a photoresist mask, and a base metal and an underplating metal having been plated onto the first wafer through the photoresist mask according to an embodiment of the present invention;

FIG. 10B is a cross-sectional diagram illustrating a patterned structure for electroplating having been created on the second wafer over the seed layer using a photoresist mask, and a base metal and an underplating metal having been plated onto the second wafer through the photoresist mask according to an embodiment of the present invention;

DETAILED DESCRIPTION OF PREFERRED EMBODIMENTS

As highlighted above, conventional approaches to forming metallurgical features of varying sizes typically involve multiple, consecutive electroplating steps, each of which involves a photoresist mask. Doing so, however, is expensive and inefficient.

Advantageously, provided herein are techniques to enable the simultaneous plating of varying size features, e.g., features of varying diameters and/or varying heights, on a semiconductor substrate. As will be described in detail below, the present techniques employ a shield to modify the electrical field effects during electroplating to control the local deposition rates. Namely, the present techniques leverage the notion that, when bumping is done on a wafer scale, the locations of coarse and fine controlled collapse chip connection (C4) connections are known for a particular layout. As such, the shield can be designed to control the local deposition rates for that layout. For a given layout, fine C4 connections are often employed in areas of tighter pitch and thus have a smaller diameter, and possibly taller feature size (for example, a copper pillar or pedestal). Conversely, coarse C4 connections are often employed in areas of looser pitch and thus have a larger diameter, and possibly shorter feature size (for example, a copper pillar or pedestal).

Further, the present techniques can be leveraged to control the local deposition rates to create varying size features as well as varying size top solder caps for C4 connections, all using a single photoresist mask. Notably, top solder caps in areas of tighter pitch oftentimes have a smaller diameter and thus are shorter, whereas top solder caps in areas of looser pitch oftentimes have a larger diameter and thus are taller.

Figure 1:
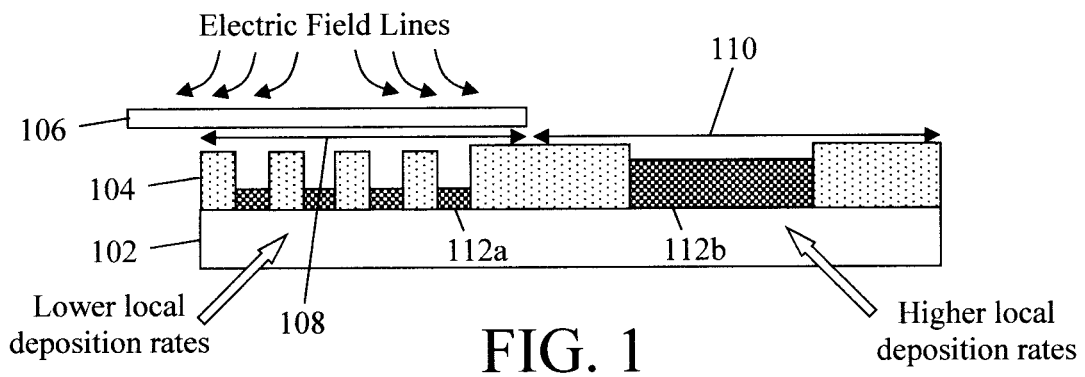
FIG. 1 is a cross-sectional diagram illustrating use of a shield to modify the electrical field effects during electroplating onto a wafer to control the local deposition rates according to an embodiment of the present invention.

This concept of using a shield to modify the electrical field effects during electroplating to control the local deposition rates is illustrated in FIG. 1. As shown in FIG. 1, a patterned photoresist mask 104 is formed on a semiconductor wafer 102. Photoresist mask 104 marks the footprint and location of one or more features of varying sizes that will be formed simultaneously on semiconductor wafer 102. By way of example, only, the features include, but are not limited to, metal pads, metal pedestals, metal pillars, etc.

According to an exemplary embodiment, wafer 102 is a bulk semiconductor wafer, such as a bulk silicon (Si), bulk germanium (Ge), bulk silicon germanium (SiGe) and/or bulk III-V semiconductor wafer. Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Although not explicitly shown in the figures, wafer 102 can contain a variety of device elements such as field effect transistors (FETs), capacitors, resistors, etc.

Standard lithography techniques can be employed to form photoresist mask 104 on wafer 102. For instance, according to an exemplary embodiment, a photoresist material is first deposited onto the wafer 102. The photoresist can be deposited onto wafer 102 using a casting process such as spin-coating or spray coating. A bake of the photoresist-coated wafer (i.e., a post-apply bake) is then performed to remove excess solvent. The photoresist is then exposed to light. Typically, exposure of the photoresist is performed using a patterned mask such that the photoresist is only exposed to the light in the unmasked regions. Following exposure, the photoresist can be baked (i.e., a post-exposure bake) to accelerate the exposure reaction. The photoresist is then contacted with a developer solution to remove the exposed or non-exposed portions of the photoresist, in the case of a positive photoresist or a negative photoresist, respectively. In the instant example, the photoresist now contains the pattern of the features to be formed on the wafer 102.

A shield 106 is placed adjacent to the surface of the wafer 102 containing the photoresist mask 104. As shown in FIG. 1, shield 106 is offset from the surface of the wafer 102. Namely, shield 106 is positioned over the surface of the wafer 102 but does not contact the wafer 102 or the photoresist mask 104. As will be described in detail below, a standoff structure can be employed to offset the shield 106 a given distance(s) from the surface of wafer 102. As also described below, the offset distance can be varied to vary the local deposition rates.

According to an exemplary embodiment, shield 106 is formed from an insulator. Suitable insulators include, but are not limited to, plastics such as polyethylene terephthalate (PET) and/or glass, e.g., soda lime glass. As shown in FIG. 1, shield 106 is designed such that at least one portion of the wafer is covered (i.e., covered portion 108) and at least one other portion of the wafer is uncovered (i.e., open portion 110).

Electroplating generally involves placing electrodes, i.e., an anode electrode and a cathode electrode, in an electrolyte.

For instance, the anode can be formed of the metal that will be used for plating, and the cathode the workpiece to be plated. In semiconductor technology, a thin (e.g., from about 0.5 nanometer (nm) to about 200 nm thick) seed layer can first be deposited onto a substrate using a process such as chemical vapor deposition (CVD), atomic layer deposition (ALD), physical vapor deposition (PVD), evaporation or sputtering. This seed layer enables deposition of the bulk metal into the feature by electroplating. For instance, a copper (Cu)-containing seed layer is often employed in Cu interconnect plating. A voltage bias is then applied to the anode and cathode electrodes.

As shown in FIG. 1, the design of shield 106 dictates the local deposition rates during the electroplating. Namely, the local deposition rate onto wafer 102 is less in areas covered by shield 106 as opposed to those areas shield 106 leaves exposed. As a result, less electroplated metal 112a is deposited in the covered portions 108 of wafer 102 and more electroplated metal 112b is deposited in the open portions 110 of wafer 102. By this process, features of different sizes (i.e., varying diameter, varying height, etc.) can be easily and effectively formed on the wafer 102 simultaneously.

The distance d shield 106 is offset from the surface of the wafer 102 (i.e., the distance between shield 106 and the surface of wafer 102) can also be adjusted to control the local deposition rate during electroplating. For instance, bringing shield 106 closer to wafer 102 (and thereby decreasing d) serves to decrease the local deposition rate. Conversely, moving shield 106 farther away from wafer 102 (and thereby increasing d) serves to increase the local deposition rate. See, for example, FIG. 2 and FIG. 3, respectively.

According to an exemplary embodiment, an adjustable standoff structure is used to control the distance d between shield 106 and wafer 102. Namely, shield 106 is attached to a portion 202 of the standoff structure that can be raised or lowered to move the shield 106 away from or towards the surface of wafer 102.

Figure 2:
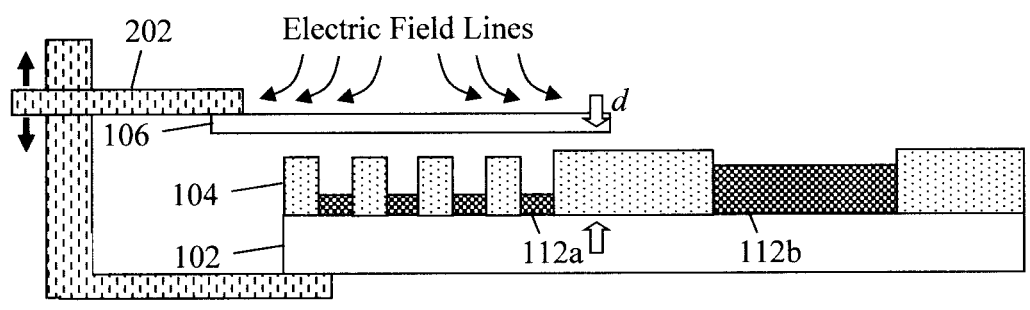
FIG. 2 is a cross-sectional diagram illustrating use of an adjustable standoff structure to vary a distance the shield is offset from the wafer according to an embodiment of the present invention.
Figure 3:
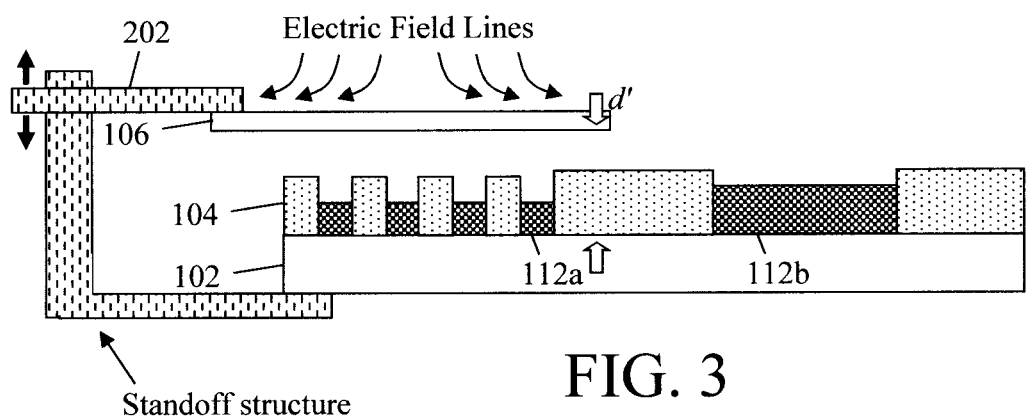
FIG. 3 is a cross-sectional diagram illustrating use of the standoff structure to increase the distance the shield is offset from the wafer according to an embodiment of the present invention.

In the example depicted in FIG. 2 and FIG. 3, the standoff structure is used to increase the distance d between shield 106 and wafer 102 (see FIG. 2) to a distance d' (see FIG. 3). Increasing the distance between shield 106 and wafer 102 from d to d' increases the local deposition rate such that the amount of electroplated metal 112a deposited in the covered portions 108 of wafer 102 is increased. Compare, e.g., FIG. 2 and FIG. 3. Likewise, increasing the distance between shield 106 and wafer 102 beyond d' will further increase the amount of electroplated metal 112a deposited in the covered portions 108 of wafer 102.

Figure 4:
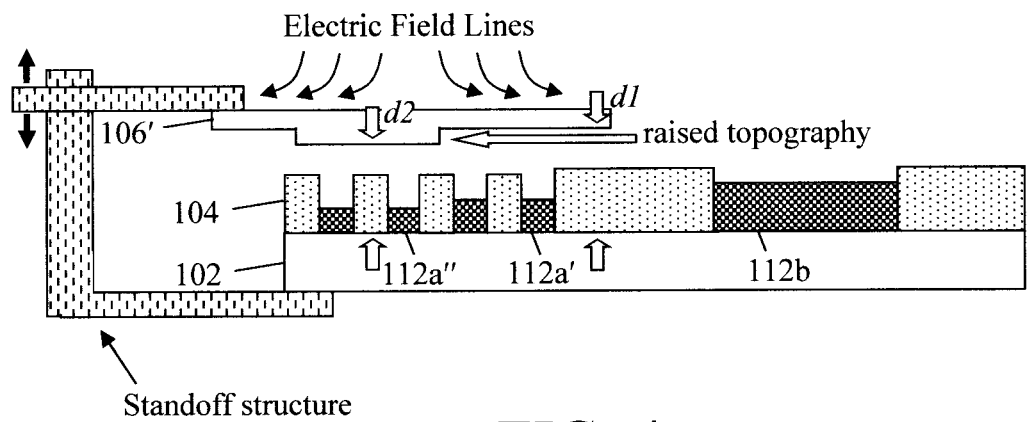
FIG. 4 is a cross-sectional diagram illustrating a variation where the shield has a topography that varies the distance between the shield and the wafer at various locations of the shield according to an embodiment of the present invention.

In the example depicted in FIGS. 1-3, it is assumed that the distance d between shield 106 and wafer 102 is uniform across the shield 106. However, embodiments are contemplated herein where shield 106 has a topography that varies the distance d between shield 106 and wafer 102 at various locations of the shield 106. See, e.g., FIG. 4. As shown in FIG. 4, a portion of shield 106' has a raised topography. As a result, that portion of the shield 106' with the raised topography is at a distance d2 from the surface of wafer 102, and other portion(s) of the shield 106' are at a distance d1 from the surface of wafer 102, wherein d1>d2. Thus, by way of this topography, decreasing the distance between shield 106' and wafer 102 from d1 to d2 decreases the local deposition rate such that the amount of electroplated metal 112a" is less than 112a', i.e., 112a"<112a'.

Figure 5:
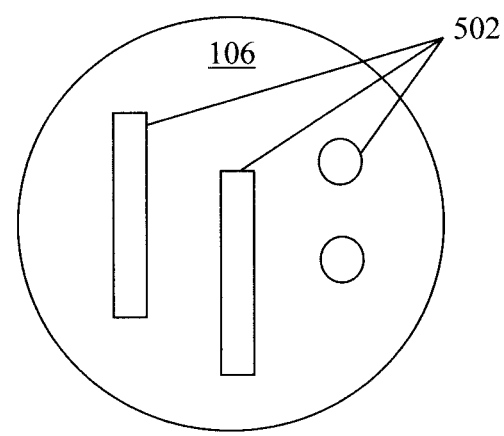
FIG. 5 is a cross-sectional diagram illustrating an exemplary one-piece shield design according to an embodiment of the present invention.

According to an exemplary embodiment, shield 106 is designed as a single piece of (insulator) material having holes, slots and/or other features patterned 502 therein. See FIG. 5. The features 502 (e.g., holes, slots, etc.) correspond to the open portions 110. The un-patterned portions of the shield correspond to the covered portions 108 which, as provided above, can optionally have a topography (not shown in FIG. 5) to further regulate the local deposition rates in the covered portions 108. Alternatively, the shield 106 can be formed from multiple pieces of the (insulator) material that are placed at certain locations over wafer 102 to regulate the local deposition rates in the covered portions 108 of wafer 102. See, e.g., FIG. 7.

Figure 6:
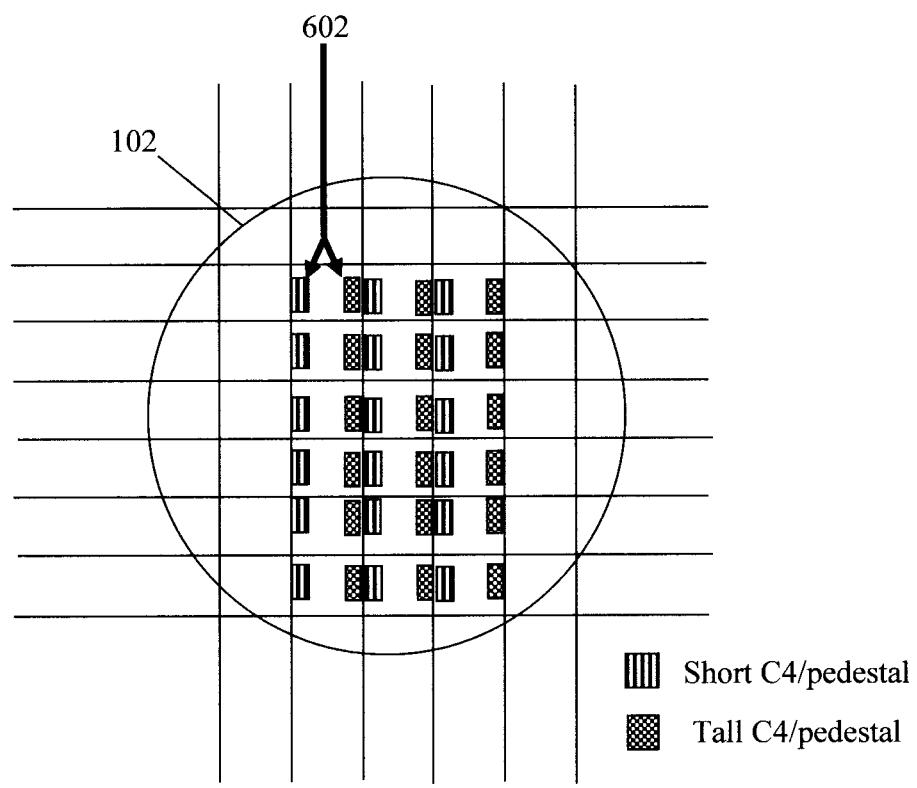
FIG. 6 is a schematic diagram illustrating an exemplary layout of metallurgical features on the wafer according to an embodiment of the present invention.

FIG. 6 is a schematic diagram illustrating an exemplary layout of metallurgical features 602 formed on wafer 102. The metallurgical features 602 are of varying sizes. For instance, in the present example, columns of pedestals of varying height (i.e., 'Short C4' and 'Tall C4') are formed alongside one another on wafer 102. While not explicitly shown in FIG. 6, features 602 can also vary in dimensions other than height. For instance, features 602 can also have varying diameters. As provided above, if conventional approaches were implemented to form these metallurgical features 602 of varying sizes, then multiple, consecutive electroplating steps would be needed. Each of these steps would involve the patterning of a separate photoresist mask. Such a process is expensive and inefficient.

Figure 7:
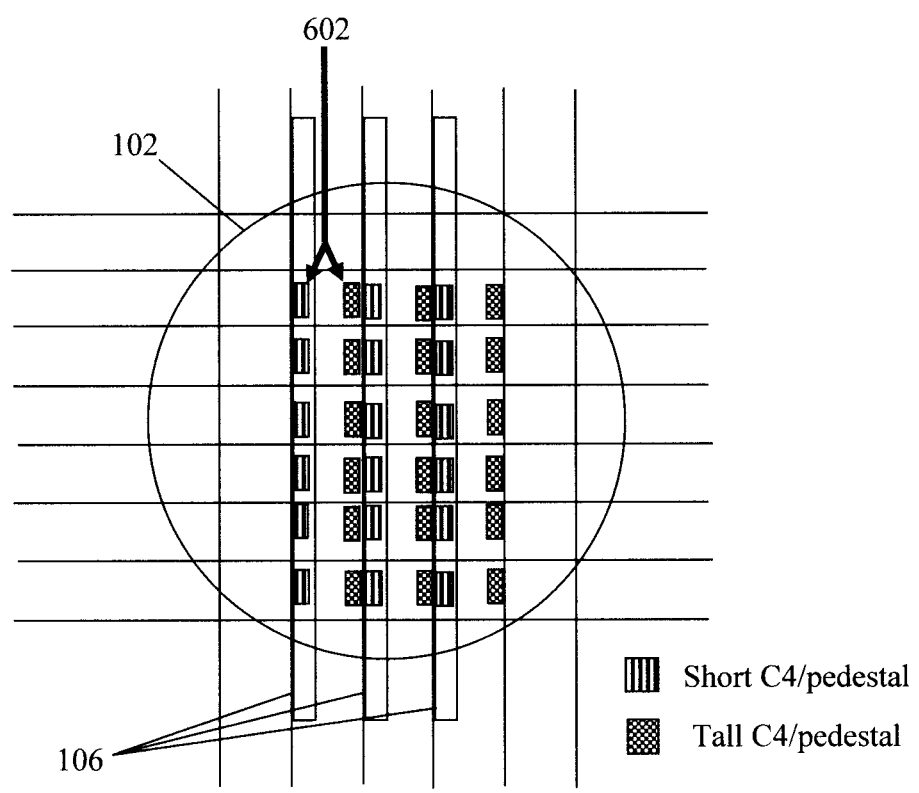
FIG. 7 is a schematic diagram illustrating an exemplary layout of the metallurgical features formed on the wafer using the present shield design to alter local deposition rates according to an embodiment of the present invention.

Advantageously, in accordance with the present techniques, these metallurgical features of varying sizes can be formed simultaneously on wafer 102 using a single photoresist mask by varying the local deposition rates during electroplating via the present shield design 106. See FIG. 7. Namely, as shown in FIG. 7, shield 106 is positioned over the columns of the C4 short pedestals. Doing so, lowers the local deposition rate for the short pedestal features 602 as compared to the deposition rate for the tall pedestal features 602 during electroplating. The details of the deposition rates for covered versus open areas of the wafer 102 vis-à-vis the design of shield 106 were provided above. As a result, less electroplated metal is deposited for the short pedestal features 602 as compared to the tall pedestal features 602. Advantageously, this differential deposition rate achieved by shield 106 enables both tall and short pedestal features 602 to be formed simultaneously via the same electroplating process using the same photoresist mask.

Figure 8:
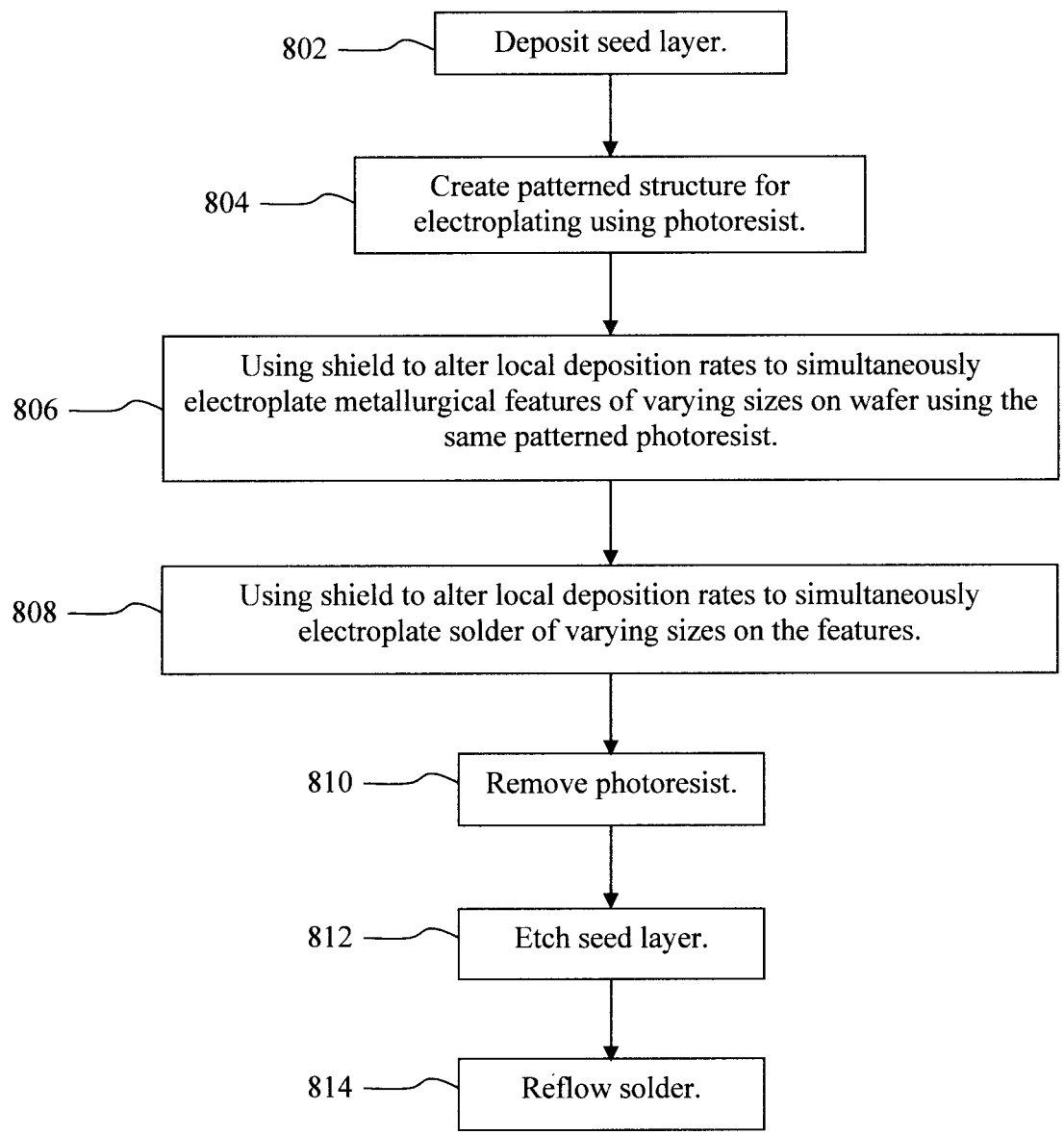
FIG. 8 is a diagram illustrating an exemplary methodology for simultaneously electroplating metallurgical features of varying sizes on a wafer according to an embodiment of the present invention.

Given the above overview of the present techniques, FIG. 8 is a diagram illustrating an exemplary methodology 800 for simultaneously electroplating metallurgical features of varying sizes on a wafer in accordance with the present techniques. In step 802, a thin seed layer is deposited onto the wafer. Suitable materials for the seed layer include, but are not limited to, copper (Cu) and/or Cu-containing alloys such as copper titanium (CuTi) and/or copper manganese (CuMn). A process such as CVD, ALD, PVD, evaporation or sputtering can be used to deposit the seed layer onto the wafer.

As will be described in detail below, according to an exemplary embodiment, the present techniques are employed in conjunction with a damascene or dual damascene process to form metallurgical features of varying sizes. With a damascene process, features such as trenches or a vias are patterned in a dielectric material, and then filled with a metal. With a dual damascene process, a trench and a via are patterned in the dielectric material typically with the trench positioned over the via. When the trench is patterned before the via, the process is referred to herein as a 'trench-first' process. Conversely, when the via is patterned before the trench, the process is referred to herein as a 'via-first' process. When methodology 800 is performed in conjunction with a damascene or dual damascene process, in step 802 the seed layer is deposited into and lining the trenches and/or vias.

In step 804, a patterned structure for electroplating is created on the wafer using a photoresist mask. As provided above, standard lithography techniques can be employed to form the photoresist mask on the wafer. For instance, a casting process such as spin-coating or spray coating is first used to deposit a photoresist material onto the wafer over the seed layer. The photoresist-coated wafer is then baked (i.e., a post-apply bake) to remove excess solvent.

An exposure and development process is then used to pattern the photoresist with the footprint and location of the metallurgical features (e.g., pads, pedestals, pillars, etc.) of varying sizes to be formed on the wafer. For instance, a patterned mask is used to expose select areas of the photoresist to light. Following exposure, the photoresist can be baked (i.e., a post-exposure bake) to accelerate the exposure reaction. The photoresist is then contacted with a developer solution to remove the exposed portions of the photoresist (in the case of a positive photoresist) or the non-exposed portions of the photoresist (in the case of a negative photoresist).

In step 806, a metal(s) is deposited onto the wafer by electroplating through the patterned photoresist mask to simultaneously form the metallurgical features (e.g., pads, pedestals and/or pillars, etc.) of varying sizes on the wafer. As provided above, this is accomplished through the use of the present shield design to control the local deposition rates during electroplating. Namely, the presence of the shield over select features in covered areas of the wafer will alter, i.e., decrease, the local deposition rate as compared to other features in open areas of the wafer. As a result, the metallurgical features formed in the covered areas of the wafer will be smaller in size as compared to the metallurgical features formed in the open areas of the wafer. See, for example, the short C4 pedestals versus the tall C4 pedestals in FIG. 7. According to an exemplary embodiment, the plated metal is Cu.

As provided above, the shield is offset from the surface of the wafer. The distance the shield is offset from the surface of the wafer can be adjusted (e.g., using an adjustable standoff structure) so as to tune the local deposition rates. Optionally, the shield has a topography that places local portions of the shield at different distances from the surface of the wafer.

Following plating of the metallurgical features, the same process can be employed to simultaneously electroplate solder of varying sizes onto the metallurgical features through the (same) patterned photoresist mask using the present shield design to control the local deposition rates during the electroplating. See step 808. Namely, the presence of the shield over select metallurgical features will decrease the local deposition rate of the solder onto those select metallurgical features as compared to the local deposition rate of the solder onto other (uncovered) metallurgical features. As a result, less solder will be deposited on the metallurgical features in the covered portions of the wafer than on the metallurgical features in the open portions of the wafer. According to an exemplary embodiment, the plated solder includes tin (Sn), silver (Ag), Cu, and/or alloys thereof such as tin-silver (SnAg) solder and/or tin-silver-copper (SnAgCu) solder.

It is notable that the (e.g., first) shield employed during electroplating of the metallurgical features can be replaced a different (e.g., second) shield when electroplating the solder and/or adjustments of the offset distance of the shield from the surface of the wafer can be made. For instance, an example will be provided below where shorter solder is needed on top of taller metallurgical features and taller solder is needed on top of shorter metallurgical features. To do so, the shield used during electroplating of the metallurgical features can be designed to provide a relatively lower local deposition rate for the shorter features as compared to the taller features. That shield can then be swapped for a different shield that is designed to provide a relatively lower local deposition rate of the solder onto the taller features as compared to the shorter features.

In step 810, the photoresist is removed. The photoresist can be removed using a common photoresist remover such as acetone or other solvent. What remains are the metallurgical features of varying sizes (e.g., of varying diameter and/or varying height) on the wafer topped with solder of varying sizes (e.g., of varying diameter and/or varying height) on the metallurgical features.

In step 812, the seed layer is etched to avoid shorts between adjacent features. In step 814 the solder can be reflowed. Reflow of the solder creates solder bumps on top of the features.

The present techniques are further illustrated by way of reference to the following non-limiting example described by way of reference to FIGS. 9-15. In the example that follows, control of local deposition rates will be used to simultaneously electroplate metallurgical features of varying sizes (e.g., of varying diameter and/or varying height) using the same patterned photoresist mask. The same process is then used to electroplate solder of varying sizes (e.g., of varying diameter and/or varying height) on top of the metallurgical features.

Further, this example illustrates how wafers (e.g., Wafer 1, Wafer 2, etc.) prepared by the present techniques can be further processed into individual die (e.g., Die 1, Die 2, etc.) and integrated into a common package design. In the context of the present techniques, the term "die" refers generally to a piece of semiconductor containing an integrated circuit. However, this example is merely meant to illustrate one of a number of exemplary implementations contemplated herein. More generally, the present techniques are broadly applicable to any integrated circuit design employing features of varying size.

As shown in FIG. 9A and FIG. 9B, the process begins with a first wafer 902A (Wafer 1) and a second wafer 902B (Wafer 2). As provided above, the use of multiple wafers is merely an example. Further, as would be apparent to one skilled in the art, the processing of first wafer 902A (Wafer 1) and second wafer 902B (Wafer 2) can be performed in any order. For instance, the steps described below can be carried out with first wafer 902A (Wafer 1) and, once first wafer 902A (Wafer 1) is completed, the steps are then repeated with second wafer 902B (Wafer 2). Alternatively, one or more of the steps described below can be carried out concurrently with first wafer 902A (Wafer 1) and second wafer 902B (Wafer 2).

According to an exemplary embodiment, wafers 902A and 902B are bulk semiconductor wafers, such as a bulk Si, bulk Ge, bulk SiGe and/or bulk III-V semiconductor wafers. Alternatively, wafers 902A and 902B can be SOI wafers having an SOI layer (e.g., a Si, Ge, SiGe, and/or a III-V semiconductor) separated from an underlying substrate by a buried insulator or BOX. Although not explicitly shown in the figures, wafers 902A and 902B can contain a variety of device elements such as field effect transistors (FETs), capacitors, resistors, etc.

Standard metallization techniques are then employed to form metal pads 904A and 904B on first wafer 902A (Wafer 1) and second wafer 902B (Wafer 2), respectively. Namely, according to an exemplary embodiment, a first dielectric stack is formed on wafer 902A and on wafer 902B, which includes at least a first dielectric layer 906A/906B and a second dielectric layer 908A/908B disposed on the first dielectric layer 906A/906B, respectively. Suitable materials for dielectric layer 906A/906B and dielectric layer 908A/908B include, but are not limited to, oxide materials such as silicon dioxide ($SiO_2$) and/or silicon oxycarbide (SiOC) and/or nitride materials such as silicon nitride (SiN) and/or silicon oxycarbonitride (SiOCN). A process such as chemical vapor deposition (CVD), atomic layer deposition (ALD) or physical vapor deposition (PVD) can be used to deposit first dielectric layer 906A/906B and second dielectric layer 908A/908B. According to an exemplary embodiment, first dielectric layer 906A/906B and second dielectric layer 908A/908B each have a thickness of from about 2 nanometers (nm) to about a 5 micrometers (µm) and ranges therebetween.

Metal pads 904A and 904B are then formed on the first dielectric stack (i.e., on dielectric layer 908A/908B, respectively). According to an exemplary embodiment, metal pads 904A and 904B are formed by first depositing a contact metal onto dielectric layer 908A/908B, respectively. Standard lithography and etching techniques are then used to pattern the contact metal into the individual metal pads 904A and 904B. Suitable contact metals include, but are not limited to, nickel (Ni), gold (Au), copper (Cu), cobalt (Co), ruthenium (Ru) and/or tungsten (W). According to an exemplary embodiment, metal pads 904A and 904B each have a thickness of from about 5 nm to about 1 µm and ranges therebetween.

A second dielectric stack is then formed on the first dielectric stack/metal pads 904A and 904B, which includes a third dielectric layer 910A/910B disposed on dielectric layer 908A/908B surrounding the metal pads 904A/904B, a fourth dielectric layer 912A/912B disposed on dielectric layer 910A/910B and metal pads 904A/904B, and a fifth dielectric 914A/914B disposed on dielectric layer 912A/912B, respectively. As above, suitable materials for dielectric layer 910A/910B, dielectric layer 912A/912B and dielectric layer 914A/914B include, but are not limited to, oxide materials such as $SiO_2$ and/or SiOC and/or nitride materials such as SiN and/or SiOCN. A process such as CVD, ALD or PVD can be used to deposit dielectric layer 910A/910B, dielectric layer 912A/912B and dielectric layer 914A/914B. According to an exemplary embodiment, dielectric layer 910A/910B, dielectric layer 912A/912B and dielectric layer 914A/914B each have a thickness of from about 2 nm to about 5 µm and ranges therebetween. According to an alternative embodiment, the topmost dielectric layer 914A/914B is a polymer dielectric such as polyimide (PI) or polybenzoxazole (PBO).

Standard lithography and etching techniques are then used to pattern trenches 916A/918A and trenches 916B/918B in the second dielectric stack. Namely, as shown in FIG. 9A trenches 916A/918A extend through dielectric layer 912A and dielectric layer 914A down to metal pads 904A, and as shown in FIG. 9B, trenches 916B/918B extend through dielectric layer 912B and dielectric layer 914B down to metal pads 904B.

Trenches 916A and 918A have different dimensions from one another, as do trenches 916B and 918B. For instance, trenches 916A has a diameter D1 and trenches 918A has a diameter D2, wherein D1>D2. Similarly, trench 916B has a diameter D3 and trench 918B has a diameter D4, wherein D3>D4. As will be described in detail below, metallurgical features of varying sizes will be formed in trenches 916A/918A and in trenches 916B/918B. For instance, the metallurgical feature that will be formed in trench 916A will be shorter and have a larger diameter than the metallurgical feature formed in trench 918A. Similarly, the metallurgical feature that will be formed in trench 916B will be shorter and have a larger diameter than the metallurgical feature formed in trench 918B.

To enable electroplating, a thin seed layer 920A/920B is then deposited onto wafer 902A and wafer 902B, lining trenches 916A/918A and trenches 916B/918B, respectively. Suitable materials for the seed layer include, but are not limited to, Cu and/or Cu-containing alloys such as CuTi and/or CuMn. A process such as CVD, ALD, PVD, evaporation or sputtering can be used to deposit seed layer 920A/920B onto wafer 902A and wafer 902B.

Next, as shown in FIG. 10A and FIG. 10B, a patterned structure for electroplating is created on the wafer over the seed layer 920A/920B using a photoresist mask 1002A/1002B. As provided above, standard lithography techniques can be employed to form the photoresist mask 1002A/1002B on wafer 902A and wafer 902B. For instance, a casting process such as spin-coating or spray coating is first used to deposit a photoresist material onto the wafer, which is then baked (i.e., a post-apply bake) to remove excess solvent. An exposure and development process is next used to pattern the photoresist with the footprint and location of the metallurgical features (e.g., pads, pedestals, pillars, etc.) of varying sizes to be formed on wafer 902A and wafer 902B over trenches 916A/918A and trenches 916B/918B, respectively. In the present example, a base metal 1004A and 1004B is first plated onto the wafer through photoresist mask 1002A/1002B. According to an exemplary embodiment, the base metal 1004A and 1004B is Cu.

Figure 11A:
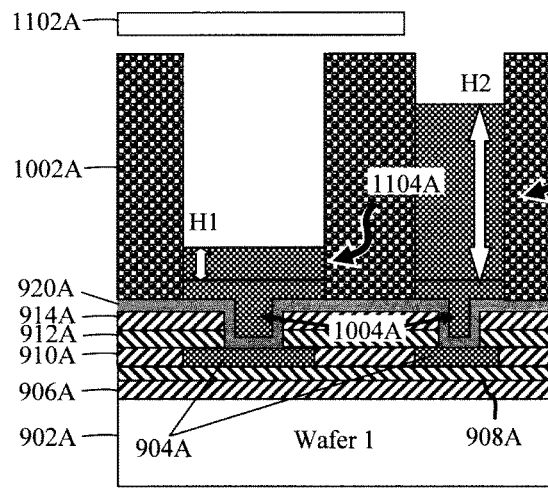
FIG. 11A is a cross-sectional diagram illustrating a shield having been positioned adjacent to, and offset from, the surface of the first wafer to control the local deposition rates during electroplating, and electroplating of a metal(s) through the patterned photoresist mask having been used to simultaneously form metallurgical features of varying sizes on the first wafer over the underplating metal according to an embodiment of the present invention.

Next, as shown in FIG. 11A, electroplating of a metal(s) (e.g., Cu) through the patterned photoresist mask 1002A is then used to simultaneously form metallurgical features 1104A and 1106A of varying sizes on wafer 902A in trenches 916A and 918A, respectively, over base metal 1004A. As shown in FIG. 11A, this is accomplished through the use of a shield 1102A that is positioned adjacent to, and offset from, the surface of wafer 902A, to control the local deposition rates during electroplating. Namely, the presence of shield 1102A over trench 916A decreases the local deposition rate into trench 916A as compared to the deposition rate into trench 918A. As a result, the metallurgical feature 1104A formed in trench 916A is smaller in size (e.g., shorter) than the metallurgical feature 1106A formed in trench 918A. For instance, as shown in FIG. 11A, metallurgical feature 1104A has a height H1 and metallurgical feature 1106A has a height H2 where H2>H1.

Figure 11B:
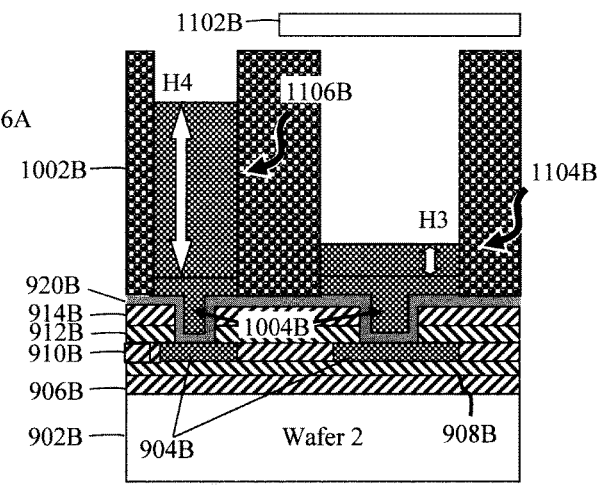
FIG. 11B is a cross-sectional diagram illustrating a shield having been positioned adjacent to, and offset from, the surface of the second wafer to control the local deposition rates during electroplating, and electroplating of a metal(s) through the patterned photoresist mask having been used to simultaneously form metallurgical features of varying sizes on the second wafer over the underplating metal according to an embodiment of the present invention.

In a similar manner, as shown in FIG. 11B, electroplating of a metal(s) (e.g., Cu) through the patterned photoresist mask 1002B is then used to simultaneously form metallurgical features 1104B and 1106B of varying sizes on wafer 902B in trenches 916B and 918B, respectively, over base metal 1004B. As shown in FIG. 11B, this is accomplished through the use of a shield 1102B that is positioned adjacent to, and offset from, the surface of wafer 902B, to control the local deposition rates during electroplating. Namely, the presence of shield 1102B over trench 916B decreases the local deposition rate into trench 916B as compared to the deposition rate into trench 918B. As a result, the metallurgical feature 1104B formed in trench 916B is smaller in size (e.g., shorter) than the metallurgical feature 1106B formed in trench 918B. For instance, as shown in FIG. 11B, metallurgical feature 1104B has a height H3 and metallurgical feature 1106B has a height H4 where H4>H3.

Figure 12A:
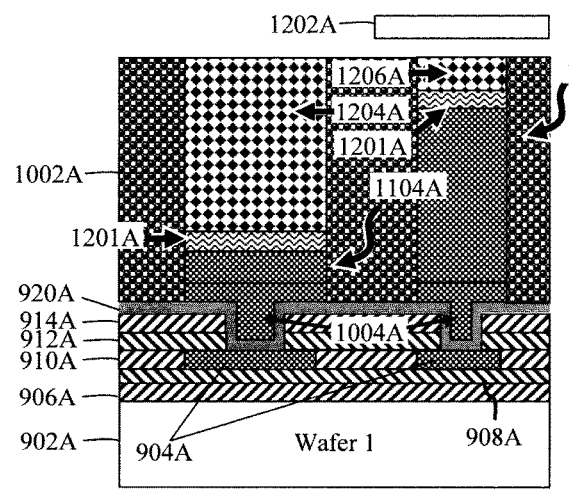
FIG. 12A is a cross-sectional diagram illustrating a different shield having been positioned adjacent to, and offset from, the surface of the first wafer to control the local deposition rates during electroplating, and electroplating through the patterned photoresist mask having been used to simultaneously deposit varying amounts of solder onto the metallurgical features of the first wafer according to an embodiment of the present invention.

Optionally, an underplating metal 1201A and 1201B is then plated onto the metallurgical features 1104A/B and 1106A/B through photoresist mask 1002A/1002B. According to an exemplary embodiment, the underplating metal 1201A and 1201B is nickel. The above-described process is then repeated (optionally with a different shield design) to plate solder onto the metallurgical features 1104A and 1106A/1104B and 1106B (e.g., over the optional underplating metal 1201A and 1201B). Namely, as shown in FIG. 12A, electroplating through patterned photoresist mask 1002A is used to simultaneously deposit varying amounts of solder 1204A and 1206A (e.g., SnAg and/or SnAgCu) onto the metallurgical features 1104A and 1106A, respectively. As shown in FIG. 12A, this is accomplished through the use of a different shield 1202A that is positioned adjacent to, and offset from, the surface of wafer 902A, to control the local deposition rates during solder deposition. Namely, the presence of shield 1202A over metallurgical feature 1106A decreases the local deposition rate and thus the amount of the solder 1206A deposited onto metallurgical feature 1106A as compared to the deposition rate/amount of solder 1204A deposited onto metallurgical feature 1104A.

Figure 12B:
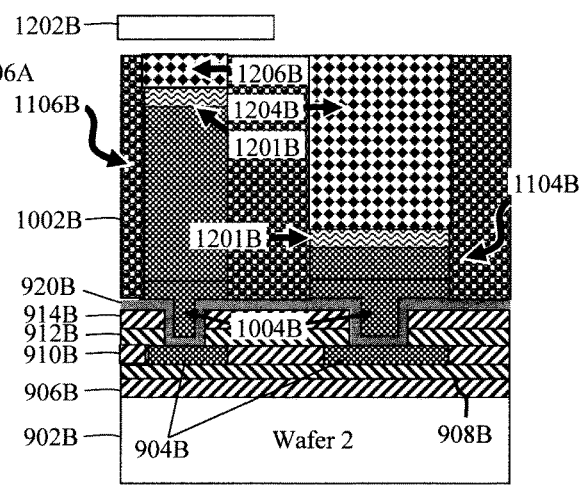
FIG. 12B is a cross-sectional diagram illustrating a different shield having been positioned adjacent to, and offset from, the surface of the second wafer to control the local deposition rates during electroplating, and electroplating through the patterned photoresist mask having been used to simultaneously deposit varying amounts of solder onto the metallurgical features of the second wafer according to an embodiment of the present invention.
Figure 13A:
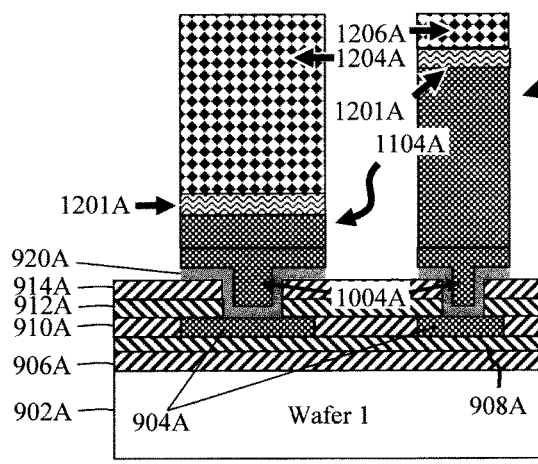
FIG. 13A is a cross-sectional diagram illustrating the patterned photoresist mask having been removed from the first wafer, and the seed layer having been etched according to an embodiment of the present invention.
Figure 13B:
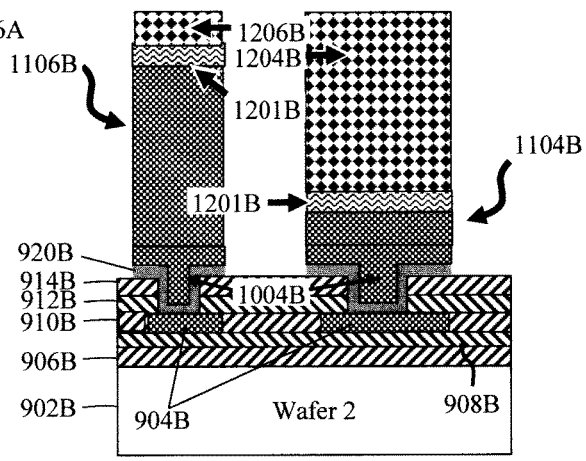
FIG. 13B is a cross-sectional diagram illustrating the patterned photoresist mask having been removed from the second wafer, and the seed layer having been etched according to an embodiment of the present invention.

In a similar manner, as shown in FIG. 12B, electroplating through patterned photoresist mask 1002B is used to simultaneously deposit varying amounts of solder 1204B and 1206B (e.g., SnAg and/or SnAgCu) onto the metallurgical features 1104A and 1106A, respectively. As shown in FIG. 12B, this is accomplished through the use of a different shield 1202B that is positioned adjacent to, and offset from, the surface of wafer 902B, to control the local deposition rates during solder deposition. Namely, the presence of shield 1202B over metallurgical feature 1106B decreases the local deposition rate and thus the amount of the solder 1206B deposited onto metallurgical feature 1106B as compared to the deposition rate/amount of solder 1204B deposited onto metallurgical feature 1104B.

Following plating of the solder 1204A/1206A and 1204B/1206B, the photoresist mask 1002A/1002B is removed. See FIG. 13A and FIG. 13B. As provided above, the photoresist mask can be removed using a common photoresist remover such as acetone or other solvent. What remains are the metallurgical features 1104A/1106A and 1104B/1106B of varying sizes (e.g., of varying diameter and/or varying height) on the wafer topped with solder 1204A/1206A and 1204B/1206B of varying sizes (e.g., of varying diameter and/or varying height) on the metallurgical features 1104A/1106A and 1104B/1106B. The seed layer 920A/920B is then etched to avoid shorts between adjacent features.

Figures 14A, 14B:
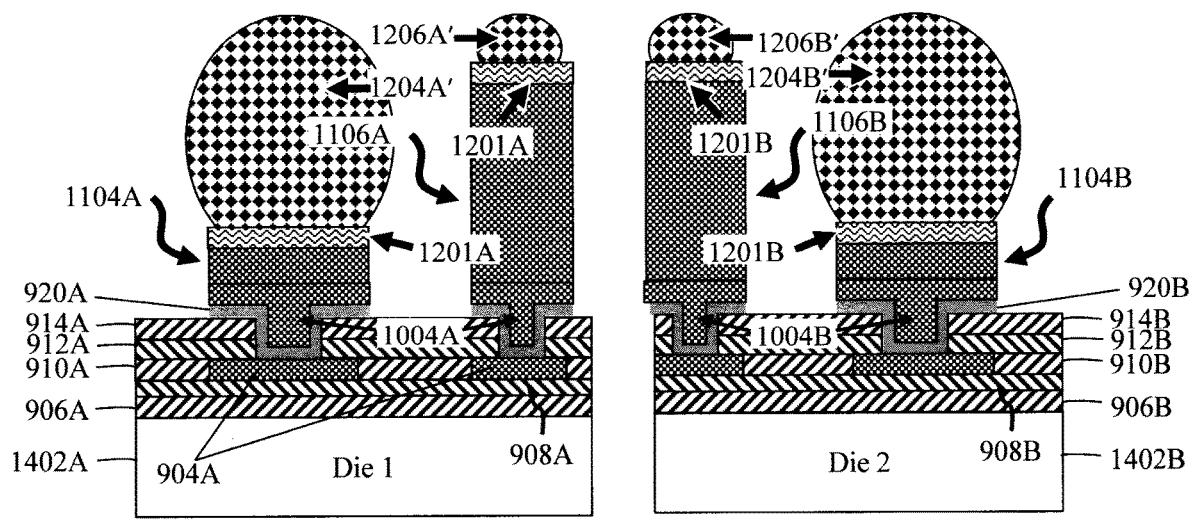
FIG. 14A is a cross-sectional diagram illustrating the solder on the first wafer having been reflowed, and the first wafer having been diced into individual die (Die 1) according to an embodiment of the present invention.
FIG. 14B is a cross-sectional diagram illustrating the solder on the second wafer having been reflowed, and the second wafer having been diced into individual die (Die 2) according to an embodiment of the present invention.

As shown in FIG. 14A and FIG. 14B, the solder 1204A/1206A and 1204B/1206B is reflowed. Reflow of the solder creates solder bumps 1204A'/1206A' and 1204B'/1206B' on top of the metallurgical features 1104A/1106A and 1104B/1106B. Wafer 902A is then diced into multiple die 1402A, e.g., Die 1 (one of which is shown in FIG. 14A) and wafer 902B is diced into multiple die 1402B, e.g., Die 2 (e.g., Die 2—one of which is shown in FIG. 14B).

Figure 15:
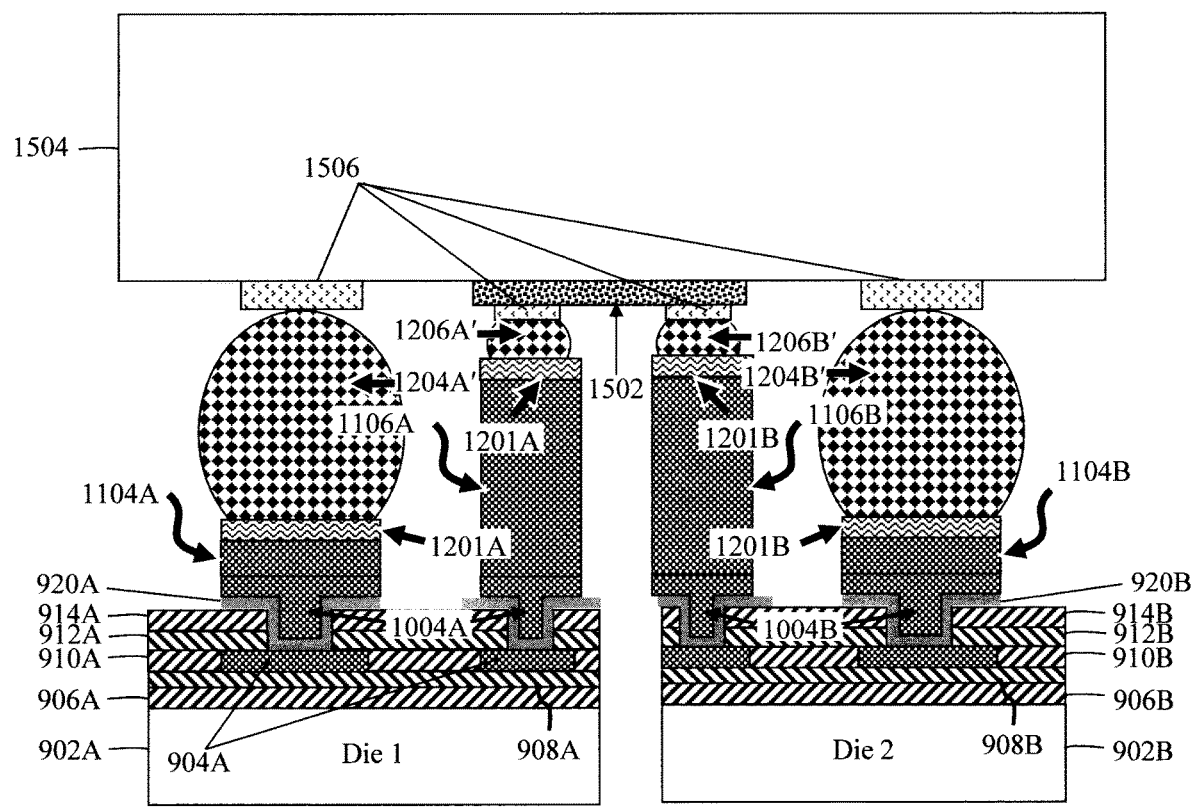
FIG. 15 is a cross-sectional diagram illustrating a Die 1 and a Die 2 having been joined to a bridge chip on a package substrate according to an embodiment of the present invention.

As shown in FIG. 15, Die 1 and Die 2 are then joined as shown, to a bridge chip 1502 on a package substrate 1504 with fine connections 1506 enabling high bandwidth communication between Die 1 and Die 2. By way of example only, in this configuration Die 1 might be an accelerator and Die 2 might be a central processing unit (CPU) or high bandwidth memory (HBM).

Figure 16:
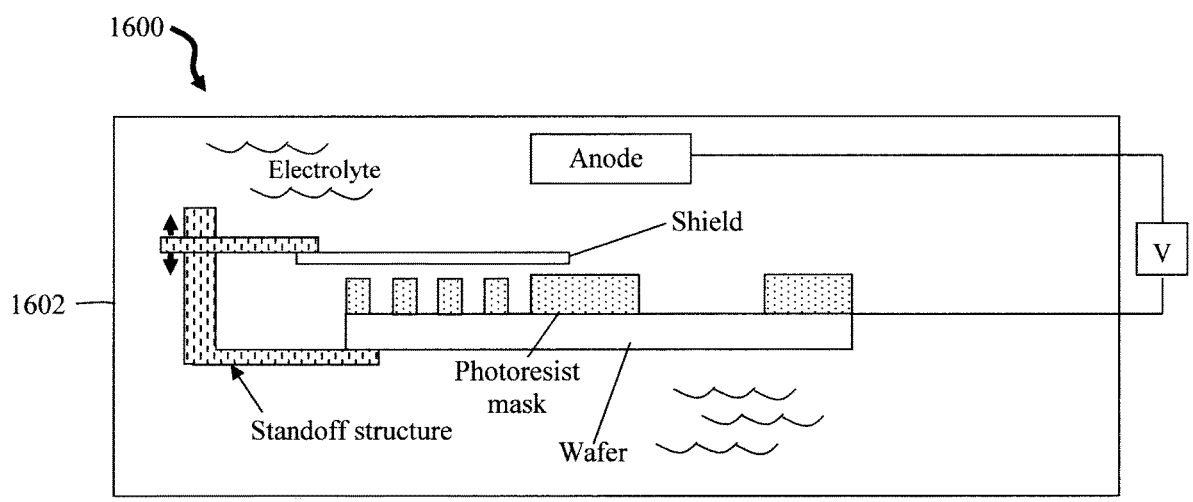
FIG. 16 is a diagram illustrating an exemplary electroplating apparatus according to an embodiment of the present invention.

FIG. 16 is a diagram illustrating an exemplary electroplating apparatus 1600. As shown in FIG. 16, electroplating apparatus 1600 includes a vessel 1602 containing an electrolyte. Immersed in the electrolyte is the above-described wafer (with photoresist mask) and shield offset from the surface of the wafer. As described above, the shield alters local deposition rates during electroplating for the portions of the wafer covered by the shield. The shield can be attached to an adjustable standoff structure that is used to vary the distance that the shield is offset from the surface of the wafer. It is understood that the backside of the wafer is protected from the electrolyte and only the front side with the features to be plated is exposed to the electrolyte. Although not explicitly shown in the figures, this back side protection of the wafer can be accomplished by the use of a wafer holder with an opening in the front for the features that need plating. Such wafer holders with back side protection are commercially-available, e.g., from Advanced Micromachining Tools GmbH (AMMT), Frankenthal, Germany.

Also immersed in the electrolyte is an anode. During electroplating, a voltage V is applied to the anode and the wafer/workpiece (i.e., the cathode).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for electroplating, the method comprising the steps of:
   placing a shield over a wafer, offset from a surface of the wafer, which covers portions of the wafer and leaves other portions of the wafer uncovered; and
   depositing at least one metal onto the wafer by electroplating to simultaneously form metallurgical features of varying sizes on the wafer based on the shield altering local deposition rates for the portions of the wafer covered by the shield.

2. The method of claim 1, wherein the metallurgical features are selected from the group consisting of: pads, pedestals, pillars, and combinations thereof.

3. The method of claim 1, wherein the metallurgical features have varying diameters.

4. The method of claim 1, wherein the metallurgical features have varying heights.

5. The method of claim 4, further comprising the steps of:
   placing a different shield over the wafer, offset from the surface of the wafer, which covers select metallurgical features and leaves other metallurgical features uncovered; and
   simultaneously depositing varying amounts of solder onto the metallurgical features by electroplating through the patterned structure based on the different shield altering local deposition rates for the select metallurgical features covered by the different shield.

6. The method of claim 5, wherein the solder is selected from the group consisting of: tin-silver (SnAg) solder, tin-silver-copper (SnAgCu) solder, and combinations thereof.

7. The method of claim 1, wherein the at least one metal comprises copper.

8. The method of claim 7, wherein the seed layer comprises a material selected from the group consisting of: copper (Cu), copper titanium (CuTi), copper manganese (CuMn), and combinations thereof.

9. The method of claim 1, wherein the shield is formed from an insulator.

10. The method of claim 9, wherein the insulator is selected from the group consisting of: plastic, glass, and combinations thereof.

11. The method of claim 1, wherein the shield is offset a distance d from the surface of the wafer, the method further comprising the step of:
varying the distance d the shield is offset from the surface of the wafer.

12. The method of claim 1, wherein the shield is attached to an adjustable standoff structure that is configured to be raised or lowered to vary the distance d the shield is offset from the surface of the wafer.

13. The method of claim 1, wherein at least one portion of the shield comprises a raised topography, wherein the portion of the shield that comprises the raised topography is at a distance d2 from the surface of the wafer, and other portions of the shield are at a distance d1 from the surface of the wafer, and wherein d1>d2.

14. The method of claim 1, further comprising the steps of:
depositing a seed layer onto the wafer;
creating a patterned structure on the wafer over the seed layer using a photoresist;
placing the shield over the patterned structure;
depositing the at least one metal onto the wafer by the electroplating through the patterned structure to simultaneously form the metallurgical features of varying sizes on the wafer;
removing the patterned structure; and
etching the seed layer.

15. The method of claim 14, wherein the seed layer comprises copper (Cu).

16. An electroplating apparatus, comprising:
a vessel containing an electrolyte;
a wafer immersed in the electrolyte; and
a shield positioned over the wafer, offset from a surface of the wafer, which covers portions of the wafer and leaves other portions of the wafer uncovered, wherein the shield is configured to alter local deposition rates during electroplating for the portions of the wafer covered by the shield.

17. The electroplating apparatus of claim 16, wherein the shield is formed from an insulator.

18. The electroplating apparatus of claim 17, wherein the insulator is selected from the group consisting of: plastic, glass, and combinations thereof.

19. The electroplating apparatus of claim 16, wherein the shield is offset a distance d from the surface of the wafer, and wherein the electroplating apparatus further comprises:
an adjustable standoff structure, to which the shield is attached, configured to vary the distance d the shield is offset from the surface of the wafer.

20. The electroplating apparatus of claim 16, wherein at least one portion of the shield comprises a raised topography, wherein the portion of the shield that comprises the raised topography is at a distance d2 from the surface of the wafer, and other portions of the shield are at a distance d1 from the surface of the wafer, and wherein d1>d2.

* * * * *